(12) United States Patent
Frey et al.

(10) Patent No.: US 7,307,277 B2
(45) Date of Patent: Dec. 11, 2007

(54) ORGANIC FIELD EFFECT TRANSISTORS

(75) Inventors: Gitti Frey, Haifa (IL); Kieran John Reynolds, Cambridge (GB); Henning Sirringhaus, Cambridge (GB); Richard Henry Friend, Cambridge (GB)

(73) Assignee: Cambridge University Technical Services Ltd., Cambridge (GB)

( * ) Notice: Subject to any disclaimer, the term of this patent is extended or adjusted under 35 U.S.C. 154(b) by 302 days.

(21) Appl. No.: 10/841,807

(22) Filed: May 7, 2004

(65) Prior Publication Data

US 2005/0023522 A1    Feb. 3, 2005

Related U.S. Application Data

(63) Continuation of application No. PCT/GB02/05054, filed on Nov. 7, 2002.

(30) Foreign Application Priority Data

Nov. 7, 2001 (GB) ................... 0126757.4

(51) Int. Cl.
*H01L 35/24* (2006.01)
*H01L 51/40* (2006.01)

(52) U.S. Cl. ......................... 257/40; 438/99
(58) Field of Classification Search .............. None
See application file for complete search history.

(56) References Cited

U.S. PATENT DOCUMENTS

| | | | |
|---|---|---|---|
| 4,996,108 A | 2/1991 | Divigalpitiya et al. | |
| 5,279,720 A | 1/1994 | Divigalpitiya | |
| 6,023,128 A * | 2/2000 | Grothe et al. | 313/506 |
| 6,416,888 B1 | 7/2002 | Kawamura et al. | |
| 6,507,026 B2 * | 1/2003 | Ikeda et al. | 250/370.09 |
| 2002/0155319 A1 | 10/2002 | Kawamura et al. | |

FOREIGN PATENT DOCUMENTS

| | | |
|---|---|---|
| EP | 0382339 | 8/1990 |
| EP | 1083776 A | 3/2001 |
| WO | WO-0079617 | 12/2000 |

OTHER PUBLICATIONS

Horowitz, Gilles, "Organic Field-Effect Transistors", *Advanced Materials* 10(5), (Mar. 23, 1998), 365-377.
Sirringhaus, Henning, et al., "Integrated Optoelectronic Devices Based on Conjugated Polymers", *Science, American Association for the Advancement of Science* 280, (Jun. 12, 1998), 1741-1744.

* cited by examiner

*Primary Examiner*—Kiesha Rose
(74) *Attorney, Agent, or Firm*—Schwegman, Lundberg, Woessner and Kluth P.A.

(57) ABSTRACT

A field effect transistor is provided which comprises a gate electrode, a source electrode, a drain electrode, at least one organic semiconducting layer, and a hole transport layer for transferring holes from said source and drain electrodes to said organic semiconducting layer, wherein said hole transport layer comprises a layered metal chalcogenide. Processes for depositing a thin layer of a layered metal dichalcogenide on a substrate and for producing top gate structures on a layered metal chalcogenide layer in the manufacture of field effect transistors according to the invention are also provided.

33 Claims, 8 Drawing Sheets

ORGANIC FIELD EFFECT TRANSISTORS

RELATED APPLICATIONS

This application is a continuation under 35 U.S.C. 111(a) of PCT/GB02/05054, filed on Nov. 7, 2002, and published in English on May 15, 2003 as WO 03/041184 A2, which claimed priority to United Kingdom Application No. 0126757.4, filed Nov. 7, 2001, which applications and publications are incorporated herein by reference.

This invention relates to organic field effect transistors having a novel hole transport layer and to process for producing the same.

Organic field-effect transistors (FETs) have recently become of interest for applications in cheap, logic circuits integrated on plastic substrates [C. Drury, et al., APL 73, 108 (1998)] and optoelectronic integrated devices and pixel transistor switches in high-resolution active-matrix displays [H. Sirringhaus, et al., Science 280, 1741 (1998), A. Dodabalapur, et al. Appl. Phys.Lett. 73, 142 (1998)]. In these FETs, the semiconducting layer comprises an organic semiconducting material. These organic semiconductors include both polymers and small organic molecules. Examples of suitable polymers include (optionally substituted) polythiophenes such as polythiophene and poly(3-alkylthiophenes) [Horowitz, Advanced Materials, 10, 365, (1998)]; and copolymers which incorporate thiophene and fluorene units such as poly-9,9' dioctyl-fluorene-co-bithiophene (F8T2) [H. Sirringhaus, et al., Applied Physics Letters, 77, 406 (2000)]. Examples of suitable small organic molecules include oligothiophenes (typically containing 3 to 6 thiophene units), pentacenes and phthalocyanines.

In test device configurations with a polymer semiconductor and inorganic metal electrodes and gate dielectric layers high-performance FETs have been demonstrated. Charge carrier mobilities up to 0.1 cm$^2$/Vs and ON-OFF current ratios of $10^6$~$10^8$ have been reached which is comparable to the performance of amorphous silicon FETs [H. Sirringhaus, et al., Advances in Solid State Physics 39, 101 (1999)].

Thin, device-quality films of conjugated polymer semiconductors can be formed by coating a solution of the polymer in an organic solvent onto the substrate. The technology is therefore ideally suited for cheap, large-area solution processing compatible with flexible, plastic substrates. In particular, it enables processing using high-resolution inkjet printing techniques to produce thin-film transistor circuits (Physics Today, February 2001).

Typical architecture of polymer FETs is shown in FIGS. 1 and 2 and in Horowitz, Advanced Materials, 10, 365, (1998).

One problem that is encountered in such devices relates to the injection of holes by the source and drain electrodes into the organic semiconducting layer. They are typically formed from metals such as thin films of gold. However, they have much lower work functions than the HOMO levels of the organic semiconducting layers into which the holes are injected. It is desirable to seek to produce devices that are as small as possible. This requires narrow source and drain electrode channels. However, because of the large difference in work function between the metal electrodes and the organic semiconducting materials, there is a barrier to the injection of charges into these materials so that the channel becomes saturated, and this is especially critical in the narrow channels of the smaller devices (see FIG. 3). For example F8T2 has an ionisation potential of 5.5 eV, which constitutes a significant energy barrier for injection of holes from a source-drain electrode of gold with a work function on the order of 5.0 eV. The homopolymer dioctylfluorene (F8) has even higher ionisation potential of 5.8 eV. In the case of F8 the energy barrier for injection from gold is so high that F8 transistor devices with gold electrodes have very poor device characteristics.

It is therefore an object of the invention to provide improved FETs which are provided with a novel hole transport layer to transfer holes from the source and drain electrodes to the organic semiconducting layer more efficiently.

It is another object of the invention to provide a process for patterning the novel hole transport film of the present invention with micrometer resolution. One of the critical steps of forming a transistor device is the formation of the channel with typical channel lengths of a few micrometers. The novel hole transport film of the present invention can be deposited as a continuous film, and a process is provided to define conducting electrodes separated by short insulating channel regions.

It is therefore an object of the invention to provide improved FETs which are provided with a novel hole transfer layer to transfer holes from the source and drain electrodes to the organic semiconducting layer.

Thus, in a first aspect of the present invention there is provided a field effect transistor comprising a gate electrode, a source electrode, a drain electrode, at least one organic semiconducting layer, and a hole transport layer for transferring holes from said source and drain electrodes to said organic semiconducting layer, wherein said hole transport layer comprises a layered metal chalcogenide.

Layered metal chalcogenides have a work function that lies near the HOMO levels of the organic materials to which they will tranport holes and they are chemically inert at the interface with the organic layer. They are easily processable in solution enabling simple, low cost manufacture of FETs.

The layered metal chalcogenides include any compounds comprising metal atoms and chalcogen atoms in a layer-type structure. Examples include layered metal dichalcogenides and layered metal monochalcogenides. The layered metal dichalcogenides have the chemical formula MX$_2$ wherein M represents a metal and X represents a chalcogen (i.e. sulfur, selenium or tellurium). The structure of the layered metal dichalcogenides preferably includes one sheet of metal atoms sandwiched between two sheets of chalcogen atoms. In the layered metal dichalcogenides, the metallic component M is preferably selected from transition metals such as titanium, zirconium, hafnium, vanadium, tantalum, niobium, molybdenum and tungsten and non-transition metals such as tin. More preferred are niobium, molybdenum, tantalum, tin and tungsten, and most preferred are niobium, molybdenum and tantalum. More preferred chalcogens are sulfur, selenium and tellurium, and most preferred are sulfur and selenium. Metals that form monochalcogenides which may be suitable include gallium, indium and thallium.

As we explain in greater detail below, the layered metal chalcogenides have several properties which make them particularly suitable for use as hole transport layers. They are chemically inert, having no dangling bonds, thus overcoming the problems of chemical interactions experienced at the interfaces of the hole transport layers with the organic semiconducting layer. The layered metal chalcogenides have a high work function which enables easier transfer of the holes from the metal chalcogenide layer to the organic semiconducting layer. Particularly advantageously, they can be processed simply and cheaply using chemical processes to give thin films.

The structure of the metal chalcogenides comprises sheets of metal atoms sandwiched between sheets of chalcogen atoms. In the layered metal dichalcogenides, for example, the metallic sheet is covalently bonded to the two adjacent sheets of chalcogens. Two adjacent $MX_2$ layers are kept together by van der Waals forces. This structure leads to extremely anisotropic mechanical, chemical and electrical properties. Exposed surfaces of these materials have no dangling bonds and, hence, are chemically inert. This makes them particularly suitable for use as hole transport layers in FETs as it removes the problem of chemical reactions at the interfaces with the organic semiconducting layer which would otherwise reduce the efficiency and effective lifetime of the FETs.

The layered metal chalcogenides exhibit high work functions in the range 4–6.5 eV, and 5–6.5 eV is particularly preferred. For example, the work functions of niobium diselenide, molybdenum disulfide, tin disulfide, tantalum disulfide, vanadium diselenide, indium selenide and gallium selenide are 5.9, 4.8, 5.2, 5.2, 5.6, 4.55 and 5.8 eV, respectively [measured by a photoemission technique as disclosed in T. Shimada, F. S. Ohuchi and B. A. Parkinson, *Jap. J App. Phys.* 33, 2696 (1994)]. The high work function, reasonable conductivity and the inertness of exposed surfaces of the layered metal chalcogenides greatly facilitate hole injection into the organic semiconducting layer in the FETs of the present invention, making them particularly efficient. This enables more holes to be transported into the organic semiconducting layer, thus helping to overcome the problem of the barrier to the injection of charges into the organic semiconducting layer that cause saturation of the channels of the prior art FETs.

The electronic properties of the layered metal chalcogenides vary widely, including insulators, semiconductors, semi-metals and true metals. The resistivity of the layered metal chalcogenides ranges from very low values such as approximately $4 \times 10^{-4}$ Ω-cm for niobium diselenide and tantalum disulfide to values such as 10 Ω-cm in molybdenum disulfide.

The structure of the layered metal dichalcogenides includes one hexagonal packed sheet of metal atoms sandwiched between two hexagonal sheets of chalcogen atoms. The coordination of the metal atoms by the chalcogen atoms is either hexagonal (e.g. titanium disulfide and vanadium disulfide) or trigonal prismatic (e.g. molybdenum disulfide and niobium disulfide). The $MX_2$ layers are kept together by van der Waals forces and several stacking polytypes exist (see FIG. 4). The weak bonding between layers, where a layer consists of a monolayer of metal atoms clad together by covalently-bonded chalcogens, leads to extremely anisotropic mechanical and electrical properties. For example, the conductivity perpendicular to the planes is down by a factor of at least $10^2$ on that in the planes for molybdenum disulfide [see J. A. Wilson and A. D. Yoffe, *Adv. Phys.* 18, 193 (1969)].

The structure of the layered metal monochalcogenides includes two hexagonal packed sheets of metal atoms sandwiched between two hexagonal sheets of chalcogen atoms in the sequence X-M-M-X. In the binary compounds, the cations prefer the tetrahedral coordination. The bonding in the X-M-M-X layer is covalent. The cation-cation bonds are responsible for the semiconducting behavior of these materials. The layers are kept together by van der Waals forces and several stacking polytypes exist. The weak bonding between layers leads to extremely anisotropic mechanical and electrical properties.

The coordination and the oxidation state of the metal atom determine the electronic properties of the material. For example, the group V metal atoms (niobium and tantalum) are in a trigonal prismatic coordination and the corresponding dichalcogenide materials are metals, while group VI atoms (molybdenum and tungsten) are also in a trigonal prismatic coordination but have a full $d_z$ band and hence are semiconductors. Molybdenum disulfide has both a hexagonal and a trigonal prismatic coordination, and can thus be either metallic or semiconducting respectively.

Although the thickness of the layer is not critical, and it will vary depending upon the identity and nature of the particular layered metal chalcogenide being used, the layered metal chalcogenide hole transport layer preferably typically has a thickness of less than 200 nm, more preferably less than 50 nm and most preferably 5 to 10 nm.

The organic semiconducting layer can comprise one or more organic semiconducting materials. Where there is more than one organic semiconducting material, these can be disposed as separate, discrete layers or as mixtures of said materials in a single layer. Any organic semiconducting material that is able to transfer charges can be used. These organic semiconductors include both polymers and small organic molecules. Examples of suitable polymers include (optionally substituted) polythiophenes, e.g. polythiophene and poly(3-alkylthiophenes) such as poly (3-hexylthiophene) (P3HT) [Horowitz, Advanced Materials, 10, 365, (1998)]; and copolymers which incorporate thiophene and fluorene units such as poly-9,9' dioctyl-fluorene-co-bithiophene (F8T2) [H. Sirringhaus, et al., Applied Physics Letters, 77, 406 (2000)]. Examples of suitable small organic molecules include oligothiophenes (typically containing 3 to 6 thiophene units), pentacenes and phthlocyanines. The contents of each of the references in this paragraph is incorporated herein by reference thereto.

The organic semiconducting layer can be deposited on the layered metal chalcogenide layer using any method suitable for the deposition of such organic layers. Although the thickness of the organic semiconducting layer is not critical, and it will vary depending upon the identity and nature of the particular material being used, the organic semiconducting layer preferably typically has a thickness of 100 to 500 nm and more preferably 200 to 400 nm.

Any suitable technique known in the art may be employed to deposit the layered metal chalcogenide hole transport layer on the source and drain electrode material (which typically has a thickness of 20 to 60 nm, more preferably 40 to 50 nm). However, the chemical route is preferred since ultra thin films can be deposited on the substrate in a low cost process.

A suitable chemical process for depositing the layered metal dichalcogenides on the source and drain electrode material is based on one developed by Frindt et al. [see P. Joensen, R. F. Frindt and S. R. Morrison, *Mat. Res. Bull.* 21, 457 (1986) and U.S. Pat. No. 4,996,108]. This process involves the following steps:

(a) intercalation of lithium atoms into the $MX_2$ compounds;

(b) addition of water to the intercalated material, resulting in the reduction of the water by the lithium atoms. The resulting hydrogen gas which is evolved between the $MX_2$ layers breaks up the stacking of the layers (exfoliation) and single layers of $MX_2$ which are suspended in the water are produced as a result;

(c) addition of a water immiscible solvent to the single layer water suspension of $MX_2$, followed by agitation of the resulting mixture, producing a thin film of $MX_2$ which is formed at the solvent/water interface; and (d) dipping the lower end of a wet glass substrate which has deposited thereon a thin film of the source and drain material (e.g. deposition by the evaporation of a thin film of gold on the glass surface), which has previously been cleaned and $O_2$ plasma treated, into the solvent/water interface, resulting in the spread of the $MX_2$ film as a thin oriented film on the surface of the source and drain material.

The following route provides an example of how the top gate transistor structures can be formed after the layered metal dichalcogenide layer has been deposited as shown above:

1) A photo resist is spun on to the $MX_2$ surface.
2) This is then baked and exposed under UV to define the required source and drain pattern.
3) The layer of source and drain material (e.g. gold) is then etched using a commercial etch. The source and drain material is etched through the $MX_2$ layer leaving the required pattern but with a conducting $MX_2$ layer in the channel.
4) This $MX_2$ then needs to be patterned; this can be achieved by oxidizing the $MX_2$ (e.g. where $MX_2$ is $MoS_2$, this can be oxidised to $MoO_3$ in a radio frequency plasma generator while $NbSe_2$ can be oxidized to $Nb_2O_5$ using concentrated hydrogen peroxide).
5) The next step is to wash off the photo resist (e.g. in acetone).
6) The organic semiconducting material is then spun on top.
7) An insulating polymer [e.g. polyvinyl phenol (PVP)] is then spun on top of the organic semiconducting material (typical thickness 100 to 500 nm, more preferably 200 to 400 nm).
8) To complete the device the gate electrode (e.g. gold) is evaporated on the insulating polymer (typical thickness 20 to 60 nm, more preferably 40 to 50 nm).

This process can be easily adapted for use with alternative substrates to glass, e.g. other inflexible substrates such as quartz and crystalline substrates of Si, GaAs, ZnSe, ZnS, GaP and InP; and flexible substrates such as polyethylene terephthalate (PET) and polyimide substrates, both of which are sufficiently robust to survive the $O_2$ plasma pre-treatment needed to make them hydrophilic, although such pre-treatment is not necessary if the substrate is hydrophilic to start with.

In the process described above the layered metal chalcogenide film is deposited on top of a conventional metal electrode, and serves mainly to enhance the charge transfer from the conventional metal such as gold to the organic semiconductor. If a highly conducting metal chalcogenide such as niobium diselenide is used the conventional metal layer can be omitted. Thus, in a further embodiment of the present invention there is provided a field effect transistor in which the layered metal chalcogenide can act as the interconnect and metal electrode of the device as well. The patterning process for the layered metal chalcogenide is performed in the same way as described above, i.e. the channel is formed by oxidation of the layered metal chalcogenide film in the channel region.

The FETs of the present invention are cheap to manufacture because the processes needed to deposit the layers are simple and most of the layered metal chalcogenides are inexpensive and readily available. In particular, the all-chemical inexpensive device processing techniques outlined above offer an easy-to-prepare, low-cost FET.

The present invention may be further understood by consideration of the following examples, with reference to the following drawings in which.

Figure 1A:
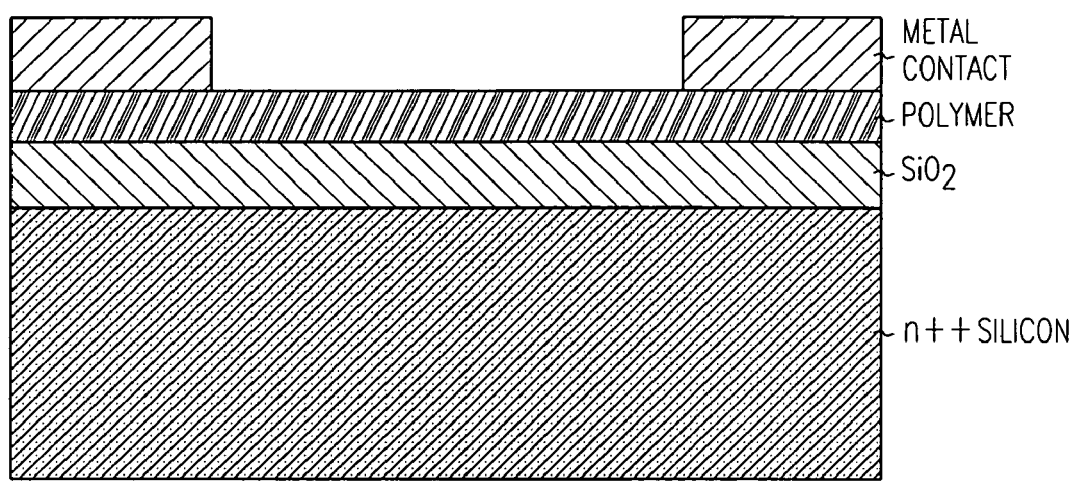
FIGS. 1 and 2 show schematic representations of typical architecture of conventional organic FETs.
Figure 1B:
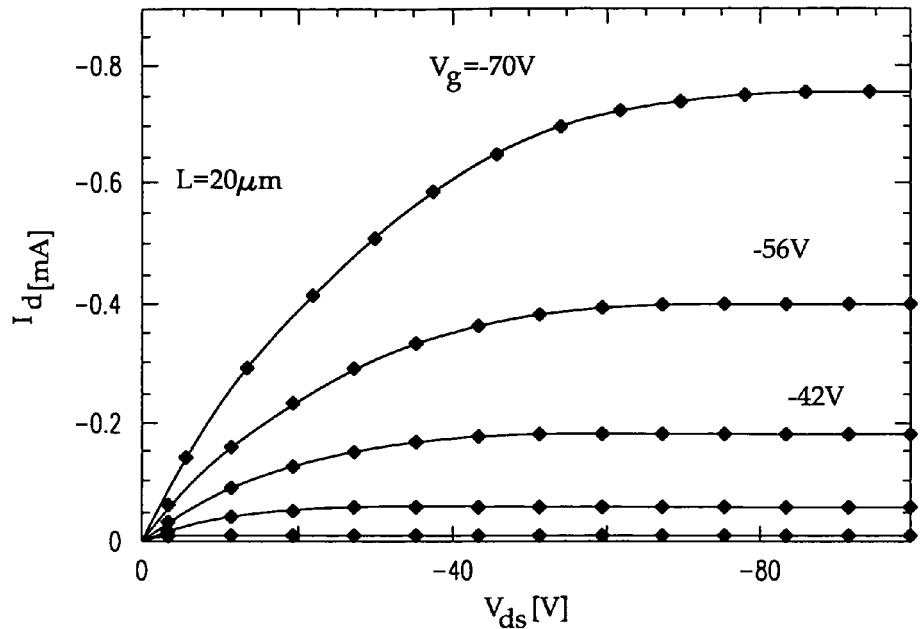
Figure 1C:
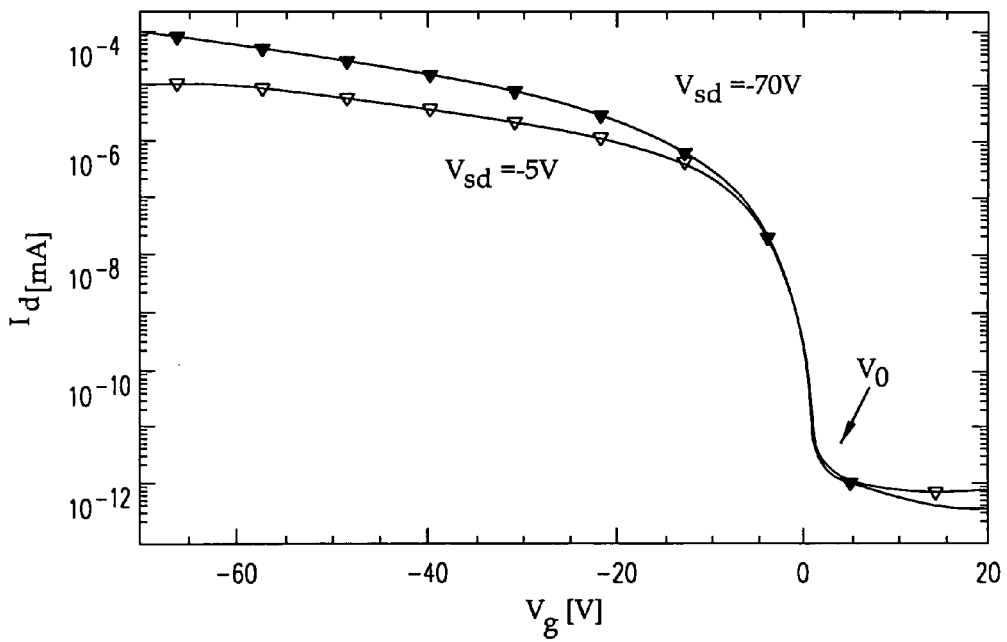
Figure 2A:
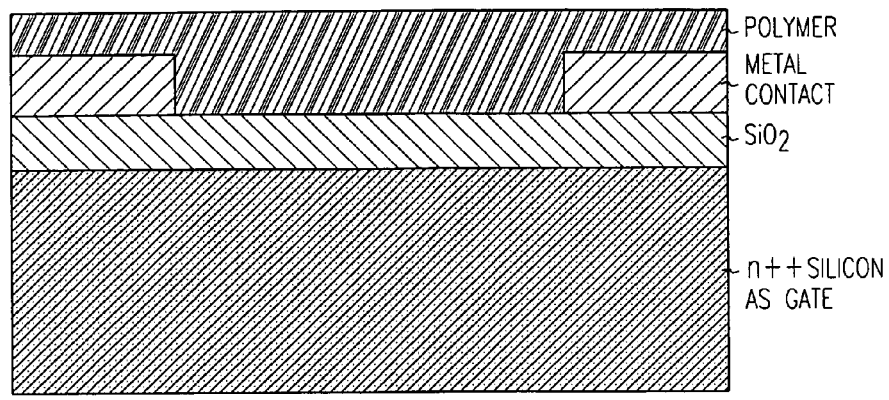
Figure 2B:
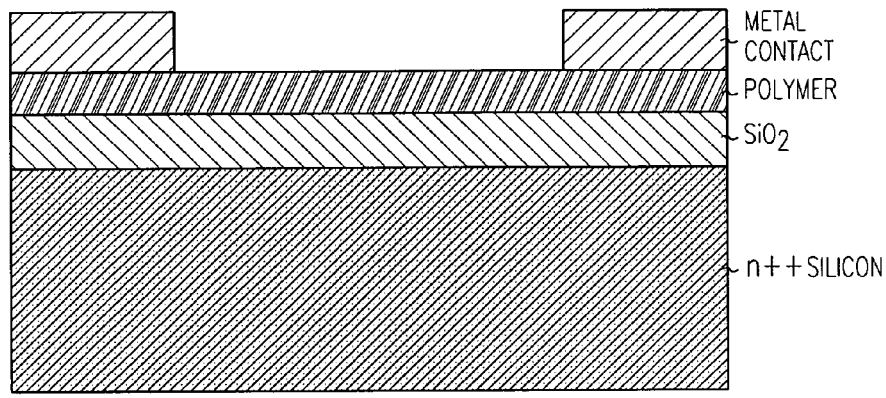
Figure 2C:
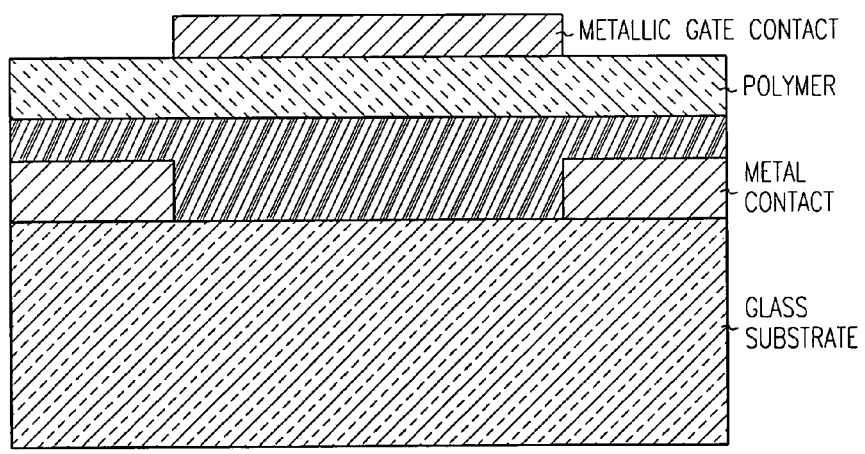
Figure 3A:
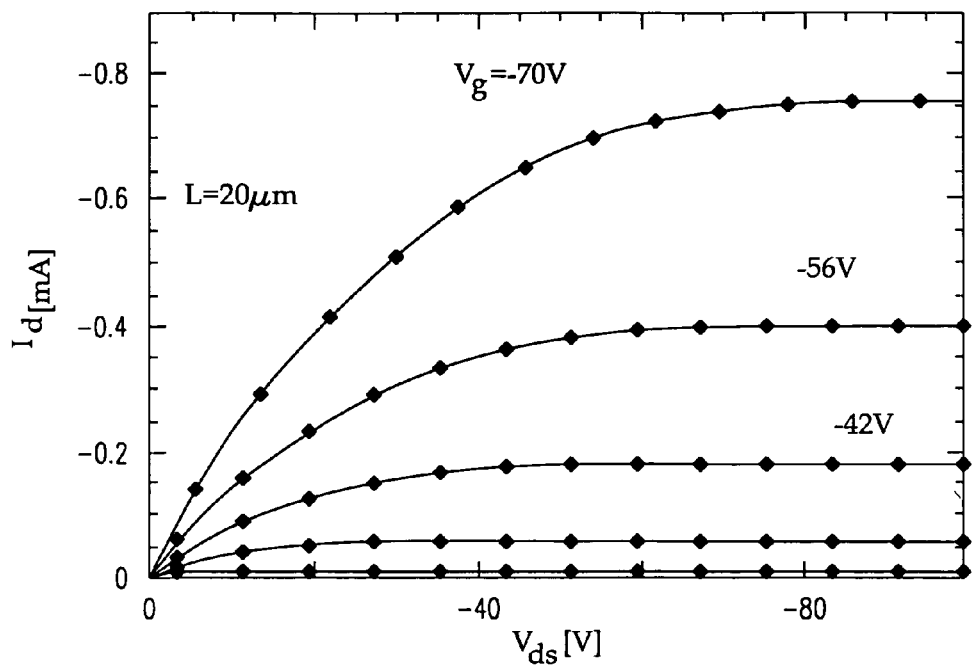
FIG. 3 shows typical output characteristics for conventional polymer FETs.
Figure 3B:
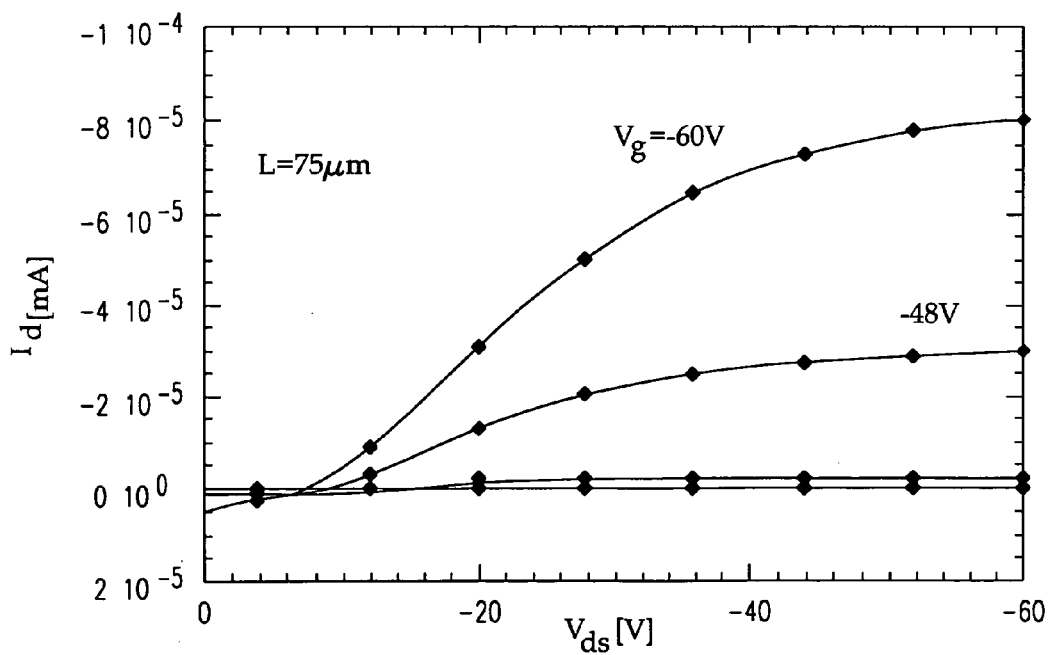
Figure 3C:
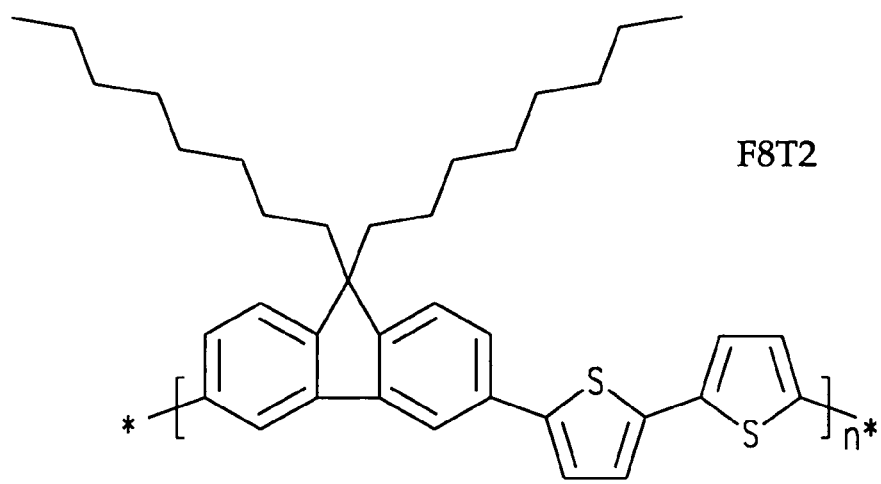
Figure 4:
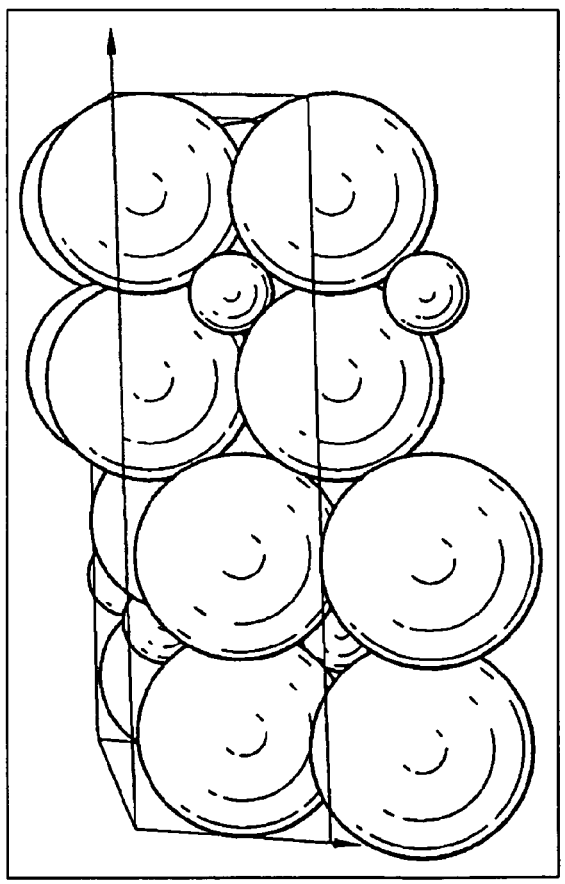
FIG. 4 shows the atomic structure of $2H-MoS_2$.
Figure 5A:
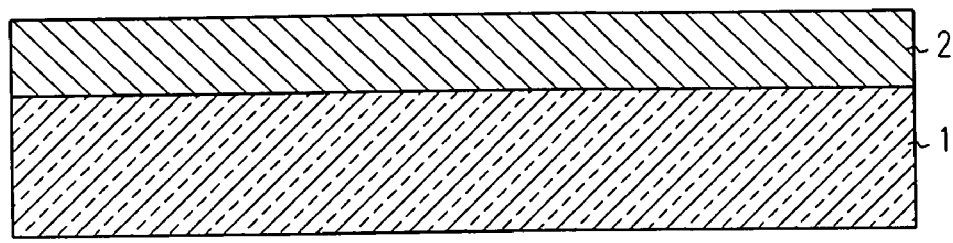
FIG. 5 shows a schematic representation of a process for the production of an organic FET according to the present invention.
Figure 5B:
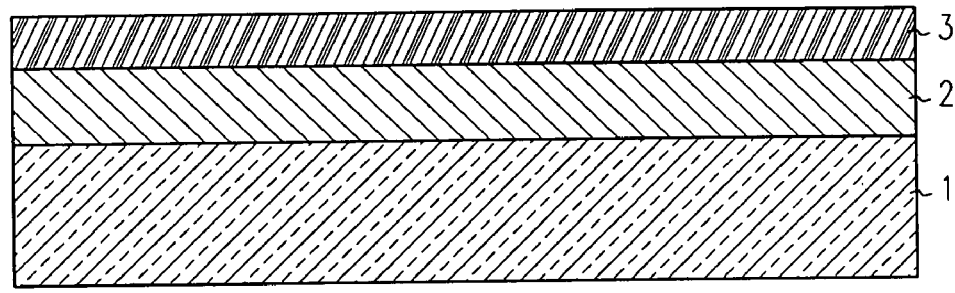
Figure 5C:
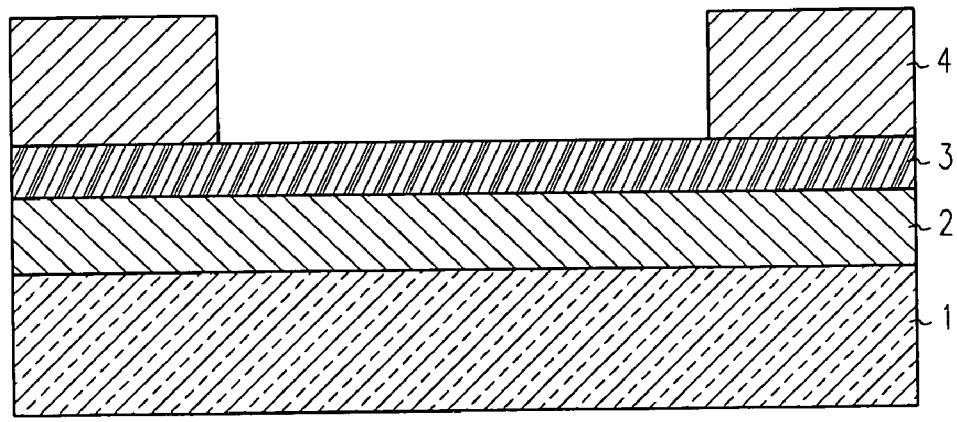
Figure 5D:
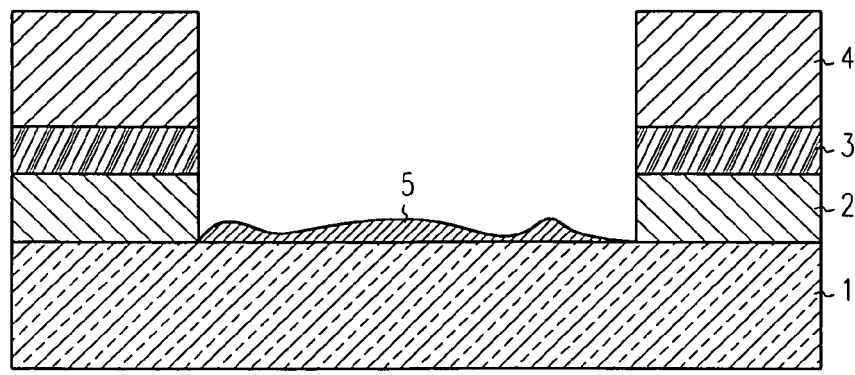
Figure 5E:
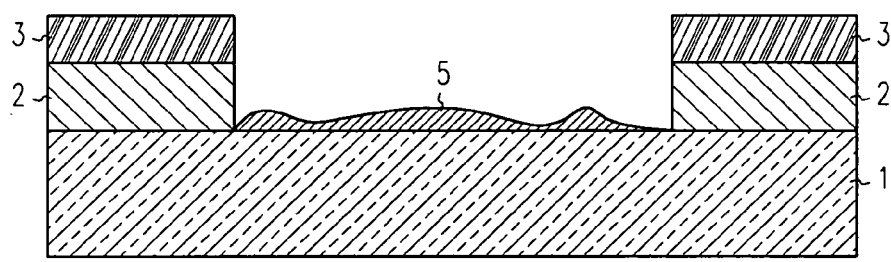
Figure 5F:
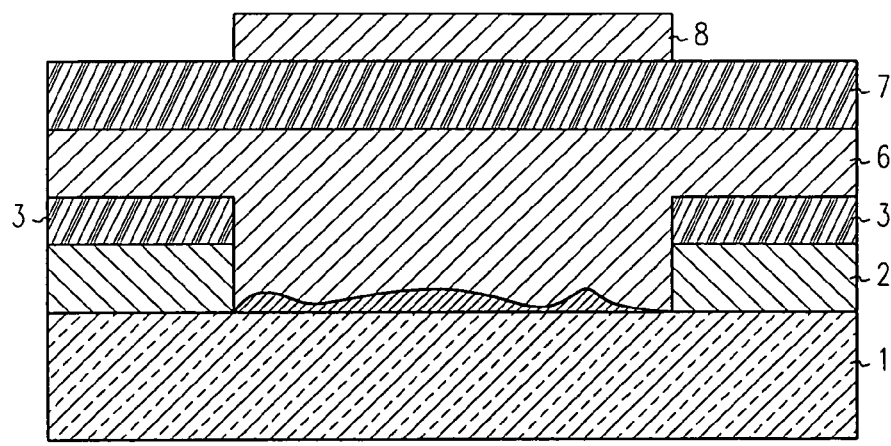

We shall first describe a process for the production of the substrate/source and drain electrode material/layered metal chalcogenide hole transport layer structure, and then describe the production of a top gate type FET using this structure. A schematic representation of this process is shown in FIG. 5.

Li Intercalation, Exfoliation and Film Formation:

Intercalation n-Butyllithium (Bu-Li) in hexane solution was used for the intercalation of lithium atoms into the layered metal dichalcogenide compounds. In a typical reaction, 0.5 g of commercial layered metal dichalcogenide ($MX_2$) powder was soaked in 1.6 M Bu-Li in hexane under argon in dried Schlenkware for 3 days in a procedure based on that disclosed in D. W. Murphy, F. J. Di Salvo, G. W. Hull Jr. and J. V. Waszczak, *Inorg. Chem.* 15, 17 (1976). The intercalation reaction is as follows:

$$y\text{Bu-Li} + MX_2 \rightarrow Li_yMX_2 + (y/2)C_8H_{18}$$

The product, $Li_yMX_2$, was washed in anhydrous hexane, dried under vacuum, then transferred and stored in a glove box. In the intercalated compounds, the lithium atoms are situated in the van der Waals gap between the $MX_2$ layer [see R. H. Friend and A. D. Yoffe, *Adv. Phys.* 36, 1 (1987)].

Exfoliation

The process used is based on that described in P. Joensen, R. F. Frindt and S. R. Morrison, *Mat. Res. Bull.* 21, 457 (1986) and U.S. Pat. No. 4,996,108. A vial was loaded in the glove box with 15–20 mg of the $Li_yMX_2$ produced in the intercalation step above and then taken out. Immediately, 5–10 ml of deionised water were added and the solution was sonicated (typically for 1 hour). An exfoliation reaction takes place as follows:

$$Li_yMX_2 + H_2O \rightarrow yLiOH + (y/2)H_2 + MX_2$$

The hydrogen gas evolved in between the $MX_2$ layers breaks up the stacking of the layers producing single layers of $MX_2$ (SL) which are suspended in the water. The SL suspension was centrifuged and the sediment was washed/agitated and centrifuged again until the pH of the supernatant was lowered to 7 indicating there was no lithium hydroxide left in the sediment.

Film Forming:

The process used is based on that described in P. Joensen, R. F. Frindt and S. R. Morrison, *Mat. Res. Bull.* 21, 457 (1986) and U.S. Pat. No. 4,996,108. 3 ml of deionised water were added to the SL sediment and the suspension sonicated for several minutes. 2–3 ml of xylene or toluene were then added to the sonicated SL suspension. The solvents do not mix and the inorganic material is in the water (lower) phase. Once the vial was shaken, a thin $MX_2$ film grew on the interface between the water and the organic solvent and also climbed up the walls of the vial. It should be noted that in some instances, further sonications may be performed after addition of the solvent and before shaking, depending on the nature of the materials used and the type of film wanted. A wetted, clean and oxygen plasma treated (10 minutes at 250 W, 0.3 mbar pressure) glass substrate (1 in FIG. 5) on which had been evaporated a 400 Å gold film (2 in FIG. 5) was then dipped into the interface. The $MX_2$ thin film (3 in FIG. 5) at the interface spread on to the surface of the gold. The thickness of the film was controlled by the concentration of the SL suspension, and was typically 10 to 100 nm.

To make top gate transistor structures the following route was used:

1. The photo resist (4 in FIG. 5) was spun on to the TMDC surface.
2. This was then baked and exposed under UV to photo-lithographically define the required source and drain pattern.
3. The gold 2 was then etched using a commercial etch. The gold 2 etched through the $MX_2$ layer leaving the required pattern but with a conducting $MX_2$ layer 3 in the channel.
4. This $MX_2$ then needed to be patterned. This was achieved by oxidizing the $MX_2$ layer 3 [e.g. where $MX_2$ is $MoS_2$, this can be oxidised to $MoO_3$ (5 in FIG. 5) in a radio frequency plasma generator while $NbSe_2$ can be oxidized to $Nb_2O_5$ (5 in FIG. 5) using concentrated hydrogen peroxide].
5. The next step was to wash off the photo resist 4 (in acetone)
6. The semiconducting polymer (6 in FIG. 5) (e.g. P3HT or F8T2) was then spun on top.
7. An insulating polymer (7 in FIG. 5) [e.g. polyvinyl phenol (PVP)] was then spun on top of the semiconducting polymer 7.
8. To complete the device the gate electrode (gold) (8 in FIG. 5) was evaporated.

Devices were tested under a nitrogen atmosphere in the glove box. The testing consisted of sweeping the source-gain voltage at a fixed gate bias (output characteristics) or sweeping the gate voltage at fixed source-drain bias (transfer characteristics).

The output characteristics show the onset of saturation and the field effect mobility is extracted from this characteristic. The transfer characteristics show the on-off ratio and the field effect. The channel length is a crucial physical parameter of the device with contact resistance becoming more important at lower channel lengths due to the increased relative current.

Figure 6:
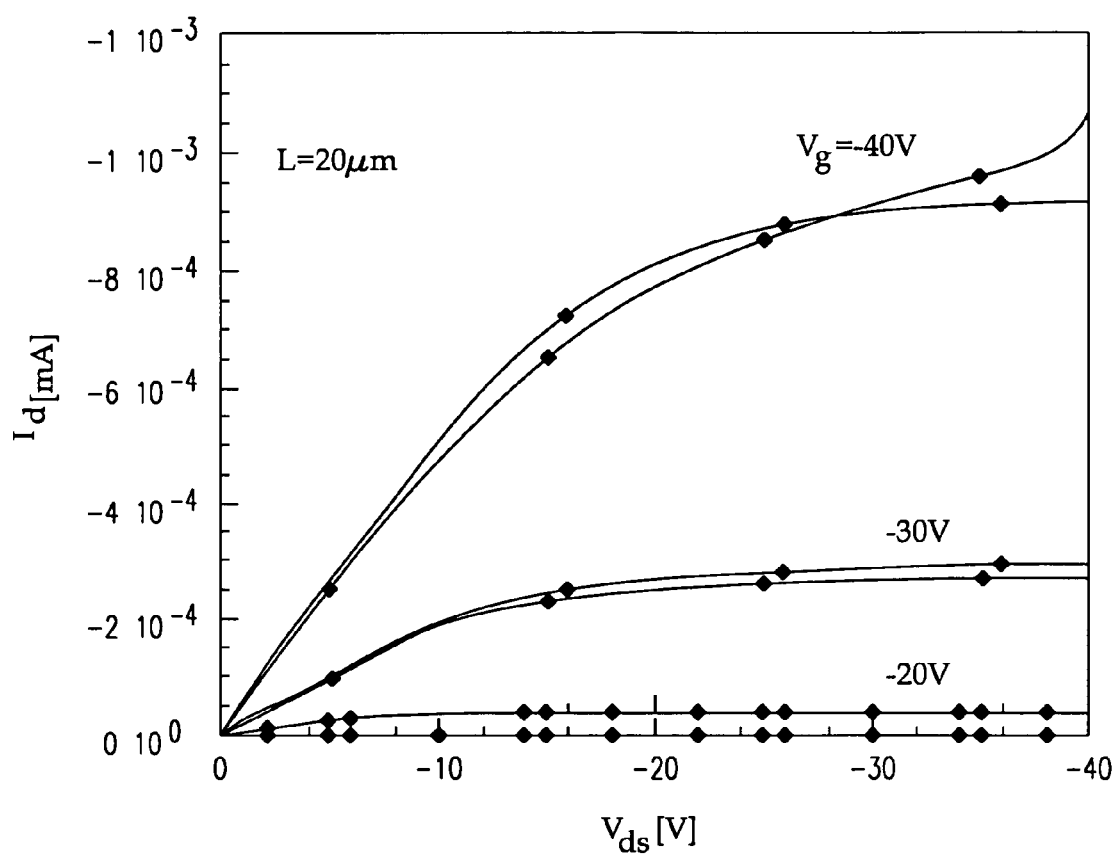
FIG. 6 shows output characteristics for the device structure $Au/MoS_2/F8T2/PVP/Au$, a polymer FET according to the present invention.

Output characteristics for a 20 μm channel length are shown in FIG. 6 for the device structure $Au/MoS_2/F8T2/PVP/Au$.

The structure shows improved hysteresis between forward and back scans, and demonstrates that $MX_2$ layers can be patterned in this manner.

As some of the layered metal chalcogenides are good conductors, in a further embodiment the source and drain electrodes can also be formed from layered metal chalcogenides instead of metals such as gold, giving further advantages in the ease of manufacture.

All publications, patents, and patent documents are incorporated by reference herein, as though individually incorporated by reference. The invention has been described with reference to various specific and preferred embodiments and techniques. However, it should be understood that many variations and modifications may be made while remaining within the spirit and scope of the invention.

The invention claimed is:

1. A field effect transistor comprising: a gate, a source, a drain, at least one organic semiconducting layer providing a channel between the source and drain, and a hole transport layer; wherein the hole transport layer comprises a layered metal chalcogenide; and wherein the hole transport layer is in contact with at least one of the source and the drain.

2. The field effect transistor of claim 1, wherein the layered metal chalcogenide is a dichalcogenide or a monochalcogenide.

3. The field effect transistor of claim 2, wherein the layered metal chalcogenide is a dichalcogenide.

4. The field effect transistor of claim 1, wherein the layered metal chalcogenide is a dichalcogenide; and wherein the metallic component is at least one of titanium, zirconium, hafnium, vanadium, tantalum, niobium, molybdenum, tungsten, or tin.

5. The field effect transistor of claim 4, wherein the metallic component is niobium, molybdenum, or tantalum.

6. The field effect transistor of claim 2, wherein the layered metal chalcogenide is a monochalcogenide.

7. The field effect transistor of claim 6, wherein the layered metal chalcogenide is a monochalcogenide; and wherein the metallic component includes at least one of gallium, indium, or thallium.

8. The field effect transistor of claim 3, wherein the chalcogen component of the layered metal chalcogenide is sulfur or selenium.

9. The field effect transistor of claim 6, wherein the chalcogen component of the layered metal chalcogenide includes at least one of sulfur or selenium.

10. The field effect transistor of claim 1, wherein the layered metal chalcogenide has a work function of from 4 to 6.5 eV.

11. The field effect transistor of claim 10, wherein the layered metal chalcogenide has a work function of from 5 to 6.5 eV.

12. The field effect transistor of claim 1, wherein the layered metal chalcogenide includes at least one of niobium diselenide, molybdenum disulfide, tin disulfide, tantalum disulfide, vanadium diselenide, indium selenide, or gallium selenide.

13. The field effect transistor of claim 12, wherein the layered metal chalcogenide is molybdenum disulfide.

14. The field effect transistor of claim 1, wherein the thickness of the metal chalcogenide layer is less than 200 nm.

15. The field effect transistor of claim 14, wherein the thickness of the metal chalcogenide layer is less than 50 nm.

16. The field effect transistor of claim 15, wherein the thickness of the metal chalcogenide layer is from 5 to 10 nm.

17. The field effect transistor of claim 1, wherein the organic semiconducting layer comprises one or more organic semiconducting materials.

18. The field effect transistor of claim 17, wherein the organic semiconducting layer comprises more than one organic semiconducting material.

19. The field effect transistor of claim 18, wherein the organic organic semiconducting material, is disposed as separate, discrete layers or as a mixture of the materials in a single layer.

20. The field effect transistor of claim 17, wherein the organic semiconducting layer comprises a semiconducting polymer selected from the group consisting of polythiophenes and copolymers having thiophene and fluorene units.

21. The field effect transistor of claim 20, wherein the semiconducting polymer is a substituted polythiophenes.

22. The field effect transistor of claim 20, wherein said organic semiconducting layer comprises a semiconducting polymer selected from the group consisting of polythiophene, poly(3-alkylthiophenes) and poly-9,9'-dioctylfluorene-co-bithiophene (F8T2).

23. The field effect transistor of claim 17, wherein the organic semiconducting layer comprises a semiconducting small organic molecule selected from the group consisting of oligothiophenes containing from 3 to 6 thiophene units, pentacenes and phthlocyanines.

24. The field effect transistor of claim 17, wherein the organic semiconducting layer has a thickness of from 100 to 500 nm.

25. The field effect transistor of claim 24, wherein the organic semiconducting layer has a thickness of from 200 to 400 nm.

26. The field effect transistor of claim 1, wherein the hole transport layer is intermediate the organic semiconducting layer and at least one of the source and the drain.

27. The field effect transistor of claim 1, wherein the layered metal chalcogenide includes surfaces that are essentially free of dangling bonds.

28. A field effect transistor, comprising: a gate, a source, a drain, at least one organic semiconducting layer, and a hole transport layer; wherein the hole transport layer comprises a layered metal chalcogenide; and wherein the layered metal chalcogenide acts as an interconnect and metal electrode of the device as well as acting as the hole transport layer.

29. The field effect transistor of claim 28, wherein the layered metal chalcogenide includes at least one of sulfur or selenium.

30. The field effect transistor of claim 28, wherein the layered metal chalcogenide is a dichalcogenide; and wherein the metallic component of the layered metal chalcogenide includes at least one of titanium, zirconium, hafnium, vanadium, tantalum, niobium, molybdenum, tungsten, or tin.

31. A field effect transistor comprising: a gate, a source, a drain, at least one organic semiconducting layer providing a channel between the source and drain, and a hole transport layer; wherein the hole transport layer comprises a layered metal chalcogenide, wherein the layered metal chalcogenide includes at least one continuous film.

32. A field effect transistor comprising: a gate, a source, a drain, at least one organic semiconducting layer providing a channel between the source and drain, and a hole transport layer; wherein the hole transport layer comprises a layered metal chalcogenide, wherein the layered metal chalcogenide includes surfaces that are essentially free of dangling bonds.

33. A field effect transistor comprising: a gate, a source, a drain, at least one organic semiconducting layer providing a channel between the source and drain, and a hole transport layer; wherein the hole transport layer comprises a layered metal chalcogenide; and wherein the layered metal chalcogenide includes at least one continuous film of metal atoms sandwiched between sheets of chalcogenide atoms.

* * * * *